United States Patent
Koyama et al.

(10) Patent No.: US 9,040,426 B2
(45) Date of Patent: May 26, 2015

(54) METHOD FOR MANUFACTURING SEMICONDUCTOR DEVICE

(71) Applicant: SUMITOMO ELECTRIC DEVICE INNOVATIONS, INC., Yokohama-shi, Kanagawa (JP)

(72) Inventors: Masatoshi Koyama, Yokohama (JP);
Kazuaki Matsuura, Yokohama (JP);
Tsutomu Komatani, Yokohama (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 73 days.

(21) Appl. No.: 13/676,717

(22) Filed: Nov. 14, 2012

(65) Prior Publication Data
US 2013/0122669 A1 May 16, 2013

(30) Foreign Application Priority Data

Nov. 14, 2011 (JP) ................. 2011-248817

(51) Int. Cl.
*H01L 21/302* (2006.01)
*H01L 29/66* (2006.01)
*H01L 21/02* (2006.01)
*H01L 29/778* (2006.01)
*H01L 29/06* (2006.01)
*H01L 29/20* (2006.01)
*H01L 29/417* (2006.01)

(52) U.S. Cl.
CPC .... *H01L 29/66045* (2013.01); *H01L 21/02107* (2013.01); *H01L 21/02104* (2013.01); *H01L 21/0217* (2013.01); *H01L 29/66462* (2013.01); *H01L 29/0692* (2013.01); *H01L 29/2003* (2013.01); *H01L 29/41758* (2013.01); *H01L 29/7786* (2013.01)

(58) Field of Classification Search
USPC ................... 438/706, 707, 710, 712
See application file for complete search history.

(56) References Cited

U.S. PATENT DOCUMENTS

| | | | | |
|---|---|---|---|---|
| 7,459,377 B2 * | 12/2008 | Ueda et al. | ............. | 438/462 |
| 7,576,373 B1 * | 8/2009 | Hikita et al. | ............. | 257/192 |
| 2011/0272742 A1 * | 11/2011 | Akiyama et al. | ............. | 257/194 |

FOREIGN PATENT DOCUMENTS

JP  5-275363 A  10/1993

OTHER PUBLICATIONS

"Active area." Semi-tracks Terms and Definitions, Terms A-C. http://www.semitracks.com/index.php/reference-material/terms-and-definitions/terms-a-c. Oct. 15, 2014.*

* cited by examiner

*Primary Examiner* — Reema Patel
(74) *Attorney, Agent, or Firm* — Westerman, Hattori, Daniels & Adrian, LLP

(57) ABSTRACT

A method for manufacturing a semiconductor device includes: forming a first active region, a second active region, an inactive region located between the first active region and the second active region, and a third active region, which crosses the inactive region to electrically connect the first active region to the second active region, in a semiconductor layer; forming an insulating layer on the semiconductor layer; and forming an opening selectively in the insulating layer by dry etching.

9 Claims, 18 Drawing Sheets

COMPARATIVE EXAMPLE

METHOD FOR MANUFACTURING SEMICONDUCTOR DEVICE

CROSS-REFERENCE TO RELATED APPLICATION

This application is based upon and claims the benefit of priority of the prior Japanese Patent Application No. 2011-248817, filed on Nov. 14, 2011, the entire contents of which are incorporated herein by reference.

BACKGROUND (i) Technical Field

The present invention relates to a method for manufacturing a semiconductor device.

(ii) Related Art

An FET (Field Effect Transistor) using a nitride semiconductor is used as an element for amplifying an output of a high frequency wave. The FET uses a 2D electron gas (2DEG) produced at a boundary face between a channel layer and an electron supply layer as a carrier. The charge-up phenomenon, which causes charging of static electricity, may occur in a manufacturing process of a semiconductor device. Japanese Patent Application Publication No. 5-275363 discloses a technique that uses a conductive thin film to transport positive electric charges generated by ion implantation.

SUMMARY

It is an object to provide a method for manufacturing a semiconductor device that is capable of reducing a leakage current and a change in threshold voltage due to the charge-up phenomenon.

According to an aspect of the present invention, there is provided a method for manufacturing a semiconductor device including: forming a first active region, a second active region, an inactive region located between the first active region and the second active region, and a third active region, which crosses the inactive region to electrically connect the first active region to the second active region, in a semiconductor layer; forming an insulating layer on the semiconductor layer; and forming an opening selectively in the insulating layer by dry etching.

According to another aspect of the present invention, there is provided a method for manufacturing a semiconductor device including: forming an insulating layer that is made of silicon nitride, of which an FTIR peak position of a silicon-nitrogen stretching vibration is less than or equal to 2160 $cm^{-1}$, or of aluminum oxide, of which an FTIR peak position of an aluminum-oxygen stretching vibration is greater than or equal to 960 $cm^{-1}$, on a semiconductor layer including a first active region and an inactive region; and forming an opening selectively in the insulating layer by dry etching.

DETAILED DESCRIPTION

The charge-up phenomenon easily occurs in the manufacturing process of a semiconductor device including a nitride semiconductor because a high voltage may be used. In particular, positive electric charges generated around a gate electrode induce a leakage current. Moreover, a semiconductor layer may be damaged, and a threshold voltage may be changed.

Figure 1:
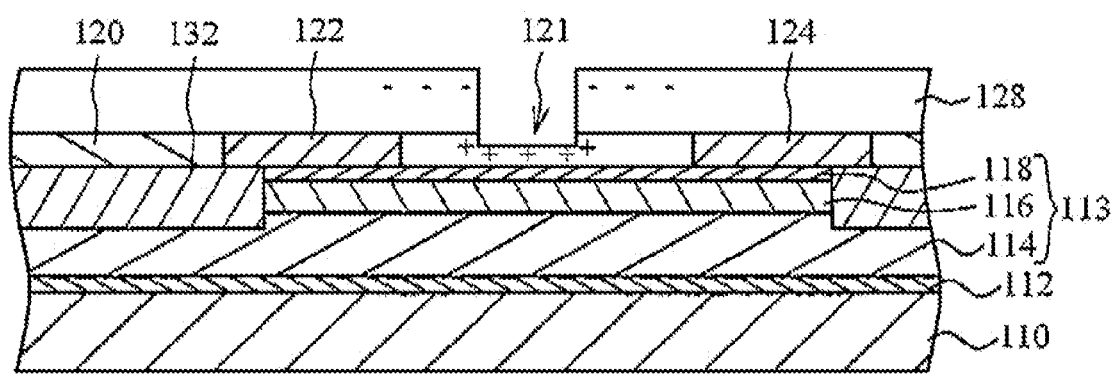
FIG. 1 is a cross-sectional view illustrating a method for manufacturing a semiconductor device in accordance with a comparative example.

A description will be first given of a comparative example. FIG. 1 is a cross-sectional view illustrating a method for manufacturing a semiconductor device in accordance with the comparative example. A part of an insulating layer 120 and a resist 128 are not hatched for clarity.

As illustrated in FIG. 1, on a substrate 110, stacked are a foundation layer 112, a gallium nitride (GaN) layer 114, an electron supply layer 116, and a cap layer 118 in this order from the substrate 110 side. An operating layer 113 is formed by a channel layer in the GaN layer 114, the electron supply layer 116, and the cap layer 118. An active region (not illustrated in FIG. 1) is a region where the operating layer 113 is active, and an inactive region 132 is a region where it is inactive. The insulating layer 120 is located on the cap layer 118. The cap layer 118 is exposed from openings of the insulating layer 120, and a source electrode 122 and a drain electrode 124 are located on the exposed cap layer 118. The resist 128 is formed on the insulating layer 120, and an opening 121 is formed in the insulating layer 120 exposed from the resist 128. A gate electrode is formed on the cap layer 118 exposed from the opening 121.

Dry etching is used to form the opening 121. Plasma etching such as RIE (Reactive Ion Etching) is an example of dry etching. A plasma treatment in RIE causes the charge-up phenomenon that the resist 128 is charged negatively as indicated with "−" in FIG. 1 and a region in the vicinity of the opening 121 of the insulating layer 120 is charged positively as indicated with "+". ICP (Inductive Coupled Plasma) etching or ECR (Electron Cyclotron Resonance) etching may be used instead of RIE, and causes the charge-up phenomenon as with RIE. Electrons flow through the insulating layer 120 from the source electrode 122 and the drain electrode 124 toward the opening 121. This causes a leakage current. As electrons are also supplied from the operating layer 113, high current flows toward the opening 121, and damages the operating layer 113. A damaged region of the operating layer 113 is removed by wet etching for example. Or, the damaged part remains. This changes a threshold voltage of the FET.

First Embodiment

Figure 2A:
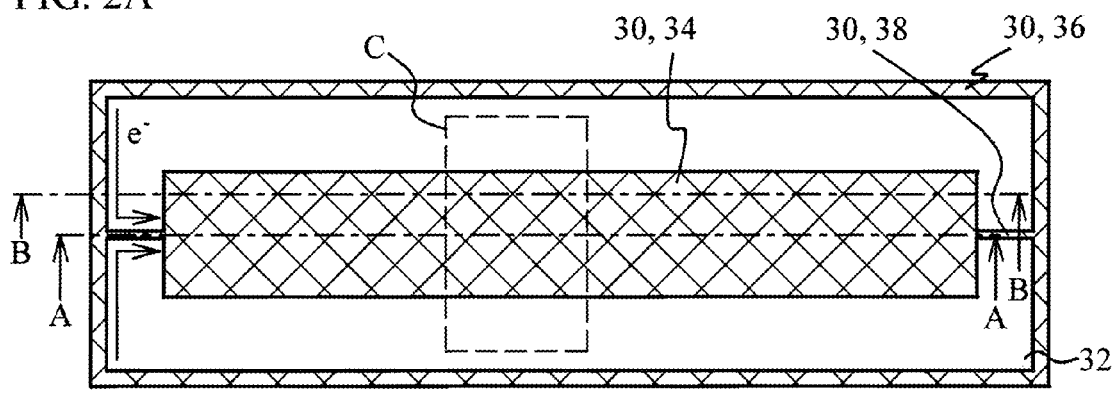
FIG. 2A is a plain view illustrating a semiconductor device in accordance with a first embodiment.
Figure 2B:
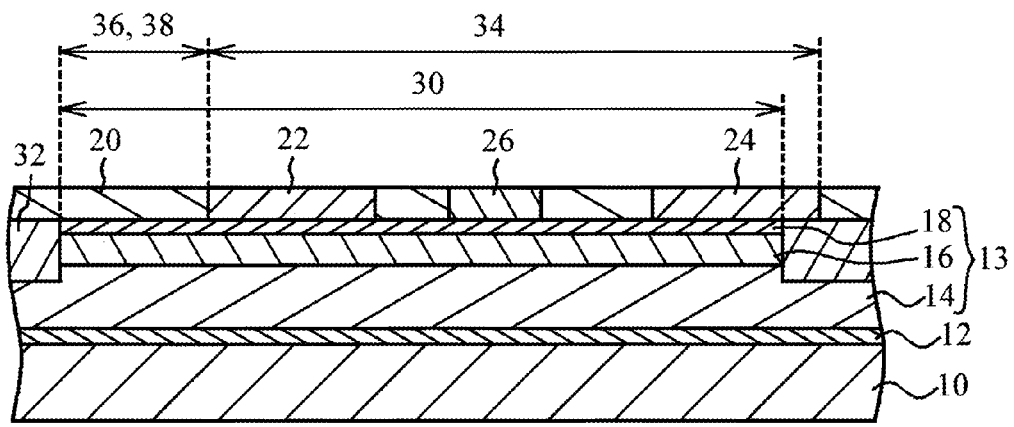
FIG. 2B is a cross-sectional view taken along line A-A in FIG. 2A.
Figure 2C:
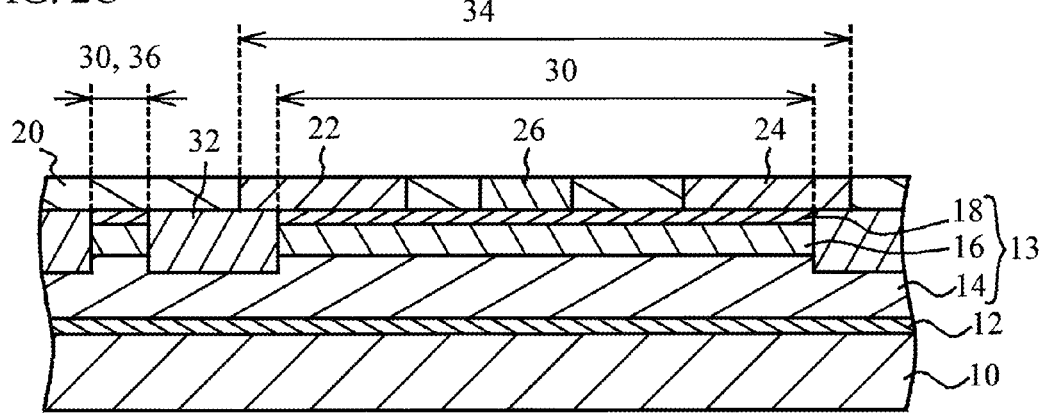
FIG. 2C is a cross-sectional view taken along line B-B in FIG. 2A.

A description will now be given of a first embodiment. The first embodiment interconnects a scribe line and the active region. The first embodiment supplies electrons to neutralize positive electric charges. FIG. 2A is a plain view illustrating a semiconductor device of the first embodiment. FIG. 2B is a cross-sectional view taken along line A-A in FIG. 2A. FIG. 2C is a cross-sectional view taken along line B-B in FIG. 2A. An insulating layer 20 is illustrated transparently in FIG. 2A. Thicknesses of layers are illustrated schematically in the cross-sectional views, and may be changed. A cross-hatched region represents an active region 30 in FIG. 2A. An FET 34 is a multi-finger type FET, but some electrodes are not illustrated in FIG. 2B and FIG. 2C. Hereinafter, some electrodes are not illustrated in the following cross-sectional views. Although not illustrated, another FET 34 is provided in an adjacent region.

As illustrated in FIG. 2A through FIG. 2C, the semiconductor device of the first embodiment includes the FET 34, a scribe line 36, and connection regions 38. A substrate 10 is made of an insulating material such as silicon carbide (SiC) with a thickness of 200 μm, for example. A foundation layer 12 is made of aluminum nitride (AlN) with a thickness of 10 nm for example. A GaN layer 14 has a thickness of 1000 nm for example. An electron supply layer 16 is made of aluminum gallium nitride (AlGaN) with a thickness of 30 nm for example. A cap layer 18 is made of GaN with a thickness of 5 nm for example. The insulating layer 20 is made of an insulating material such as silicon nitride (SiN) or aluminum oxide ($Al_2O_3$) for example. A source electrode 22 and a drain electrode 24 are ohmic electrodes formed by stacking metals such as titanium and aluminum (Ti/Al) in this order from the cap layer 18 side for example. A gate electrode 26 is formed by stacking nickel and gold (Ni/Au) in this order from the cap layer 18 side for example.

A part of an operating layer 13, which is formed by a channel layer in the GaN layer 14, the electron supply layer 16, and the cap layer 18, is the active region 30 where the operating layer 13 is active. As illustrated in FIG. 2A through FIG. 2C, the FET 34 and the scribe line 36 include the active regions 30. Another part of the operating layer 13 is an inactive region 32. The inactive region 32 surrounds the FET 34. The connection regions 38 are made of the active region 30, and cross the inactive region 32 to electrically connect the active region 30 in the FET 34 to the active region 30 in the scribe line 36. The active region 30 in the FET 34 is referred to as a first active region, the active region 30 in the scribe line 36 is referred to as a second active region, and the connection regions 38 are referred to as third active regions. Arrows in FIG. 2A represent a hypothetical movement of electrons during an RIE process described later.

Figure 3:
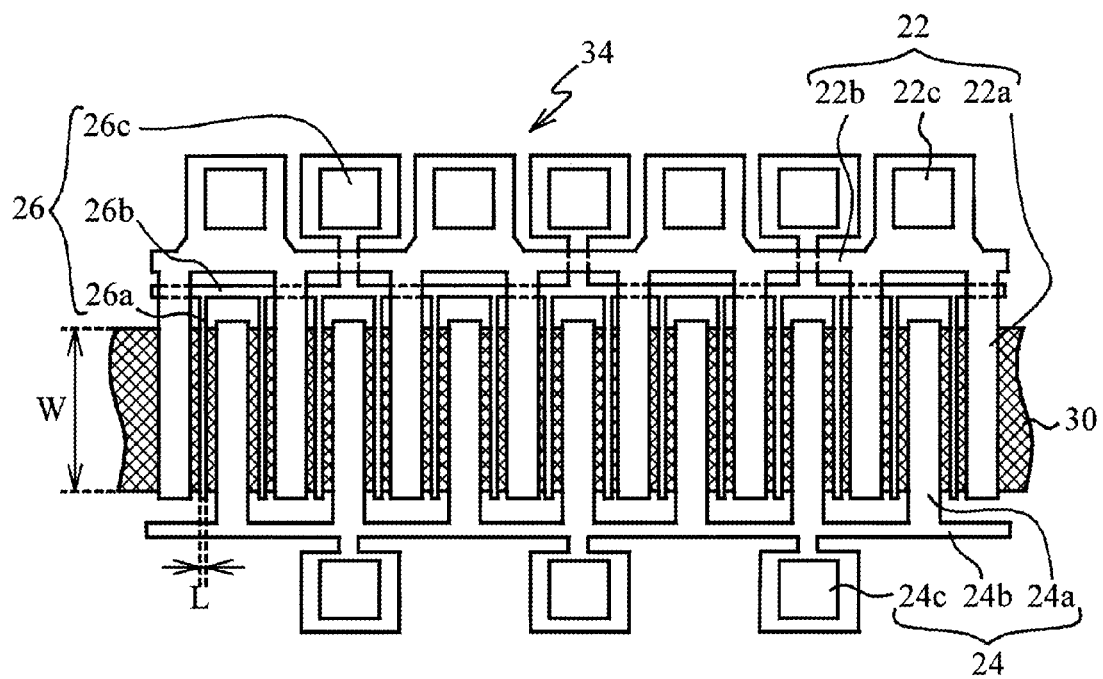
FIG. 3 is an enlarged view of a region defined by a rectangle C in FIG. 2A.

FIG. 3 is an enlarged view of a region defined by a rectangle C in FIG. 2A. As illustrated in FIG. 3, the source electrode 22 includes source fingers 22a, a connecting portion 22b interconnecting the source fingers 22a, and source pads 22c. The drain electrode 24 includes drain fingers 24a, a connecting portion 24b, and drain pads 24c. The gate electrode 26 includes gate fingers 26a, a connecting portion 26b, and gate pads 26c. The source fingers 22a and the drain fingers 24a are arranged alternately to face each other. The gate fingers 26a are arranged between the source fingers 22a and the drain fingers 24a. The size of each electrode and the number of fingers may be changed.

Next, a description will be given of a method for manufacturing the semiconductor device of the first embodiment. FIG. 4A through FIG. 5B are cross-sectional views illustrating the method for manufacturing the semiconductor device of the first embodiment, and correspond to the cross-section taken along line A-A in FIG. 2A.

Figure 4A:
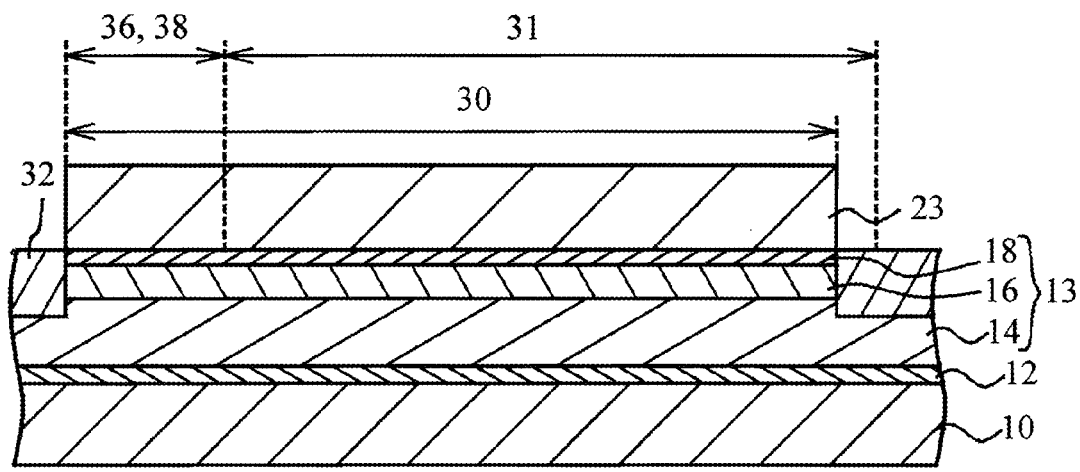
FIG. 4A and FIG. 4B are cross-sectional views illustrating a method for manufacturing the semiconductor device in accordance with the first embodiment.

As illustrated in FIG. 4A, on the substrate 10, epitaxially grown are the foundation layer 12, the GaN layer 14, the electron supply layer 16, and the cap layer 18 by MOCVD (Metal Organic Chemical Vapor Deposition). A resist 23 is formed on the cap layer 18. Noble gas ion such as argon ion ($Ar^+$) is injected into the operating layer 13 exposed from the resist 23 to form the inactive region 32. At this point, the resist 23 covers a part of an FET region 31, in which the FET 34 is formed, the scribe line 36, and the connection regions 38, and thus allows them to remain the active regions 30.

Figure 4B:
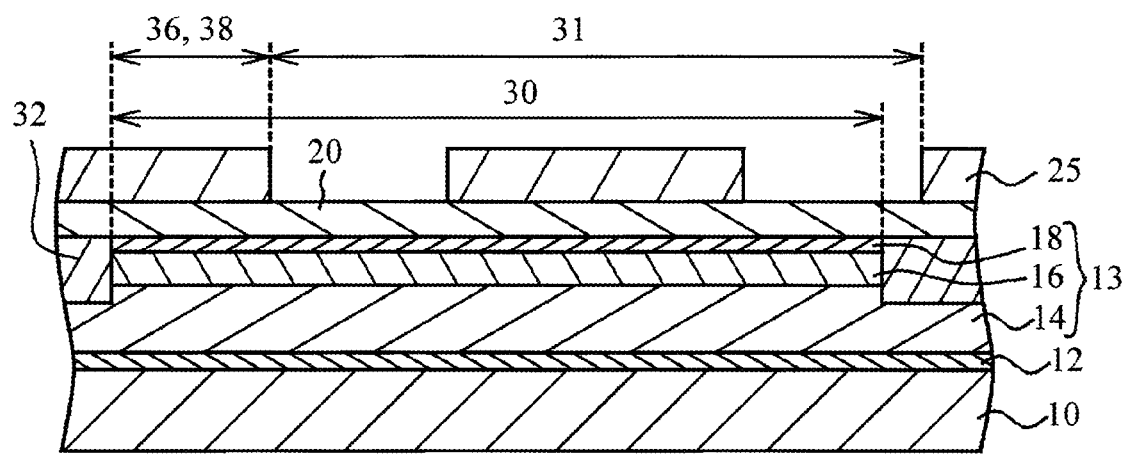
Figure 5A:
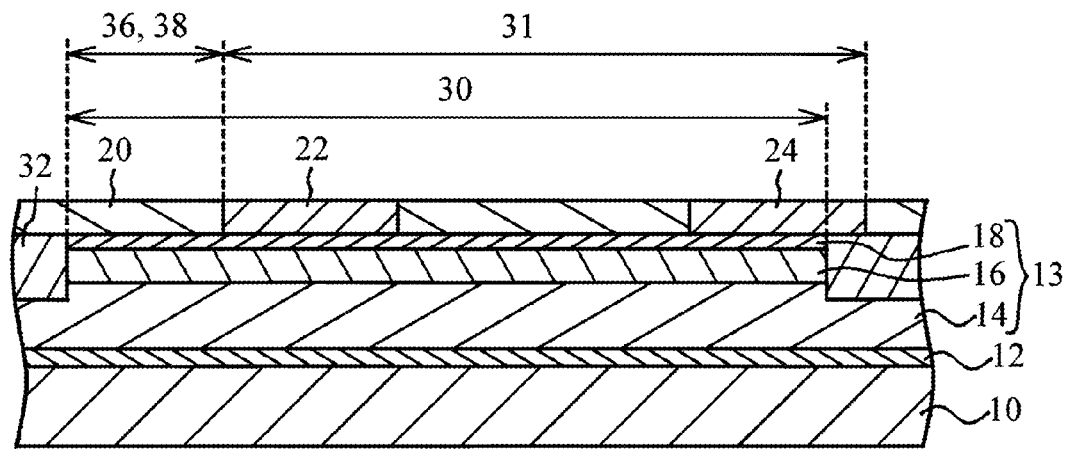
FIG. 5A and FIG. 5B are cross-sectional views illustrating the method for manufacturing the semiconductor device in accordance with the first embodiment.

As illustrated in FIG. 4B, the resist 23 is removed, and the insulating layer 20 made of SiN is then formed on the cap layer 18 by PECVD (Plasma-enhanced CVD) for example. A resist 25 is formed on the insulating layer 20. Openings are formed in the insulating layer 20 by dry etching such as RIE for example. As illustrated in FIG. 5A, the source electrode 22 and the drain electrode 24 are formed by evaporation or the like for example.

Figure 5B:
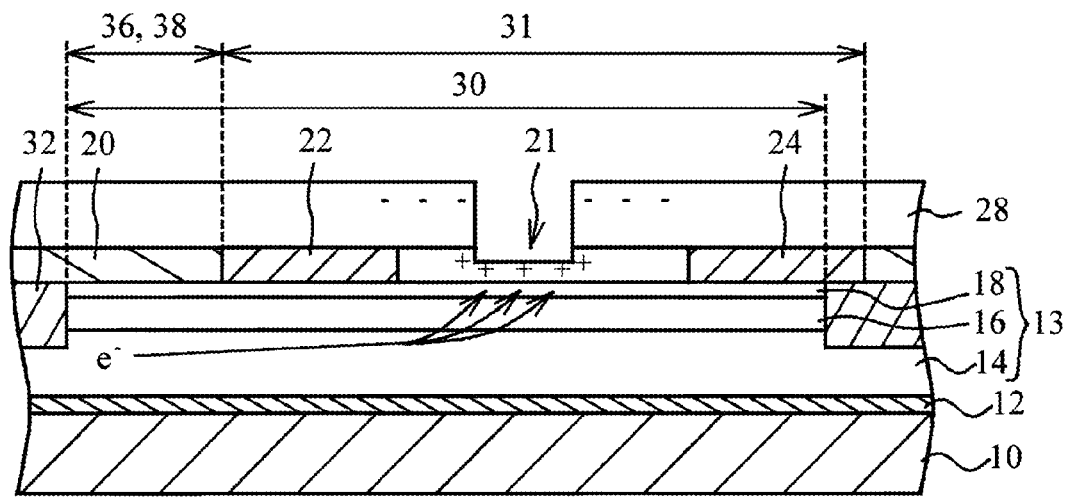

As illustrated in FIG. 5B, a resist 28 having an opening is formed on the insulating layer 20, and then an opening 21 is selectively formed in a position where the gate electrode 26 is to be formed in the insulating layer 20. At this point, as the active region 30 is connected with the scribe line 36 through the connection regions 38, a path of electrons is established as indicated with arrows in FIG. 5B. This enables to cancel out positive electric charges accumulated in the insulating layer 20, and reduce the accumulated charges. Accordingly, the leakage current between source and gate is reduced. The damage to the operating layer 13 due to flow of high current through the insulating layer 20 is also prevented. Therefore, the change in threshold voltage is reduced. The FET 34 is formed in the FET region 31 by forming the gate electrode 26 in the opening 21. Individual semiconductor devices are formed by cutting the nitride semiconductor layer and the substrate 10 along the scribe line 36.

The first embodiment uses two connection regions 38 connecting the FET 34 with the scribe line 36 as illustrated in FIG. 2A, and thus enables to cancel out the positive electric charges accumulated in the insulating layer 20. This reduces accumulated charges. The number and the arrangement of the connection regions 38 may be changed. FIG. 6A through FIG. 10B are plain views illustrating semiconductor devices in accordance with variations of the first embodiment.

Figure 6A:
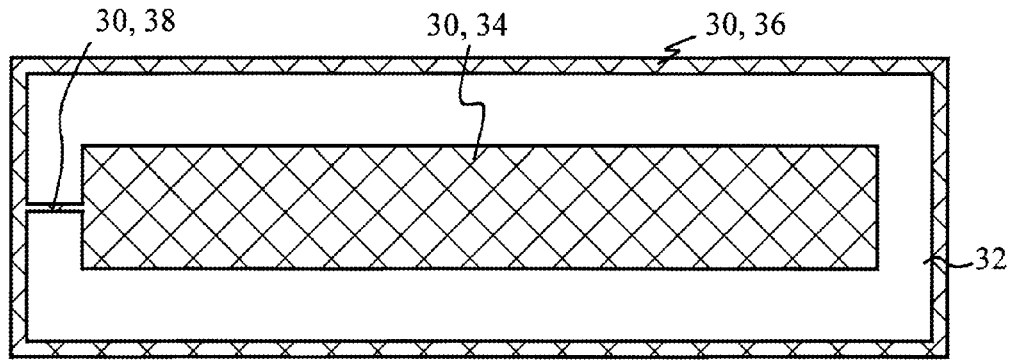
FIG. 6A through FIG. 6D are plain views illustrating semiconductor devices in accordance with variations of the first embodiment.
Figure 6B:
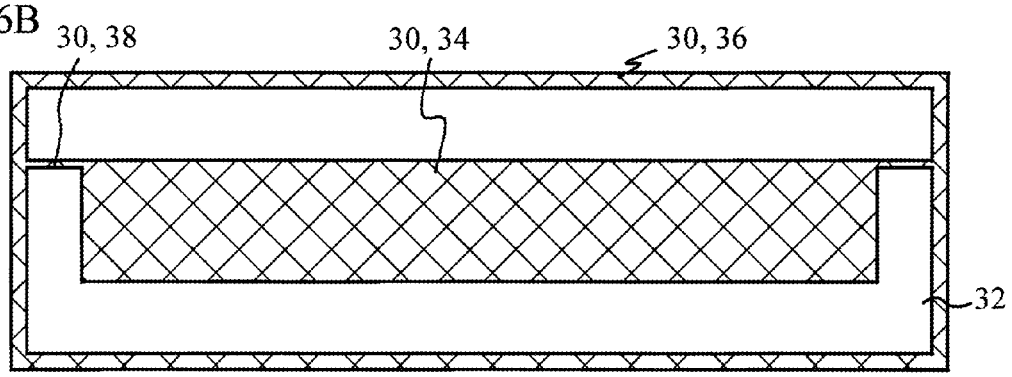
Figure 6C:
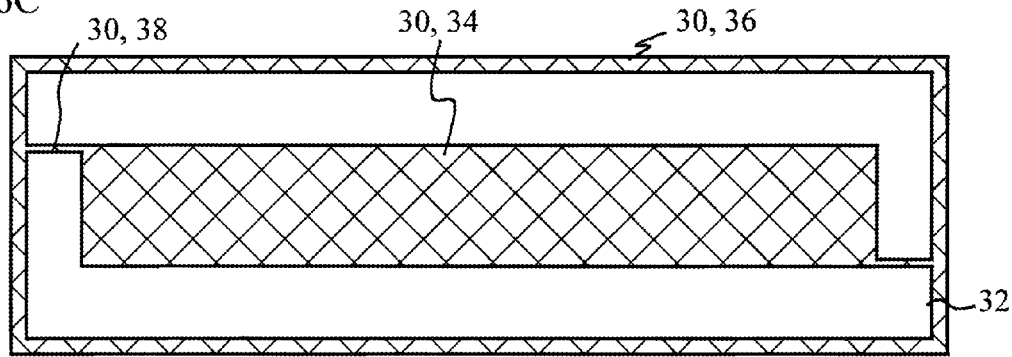
Figure 6D:
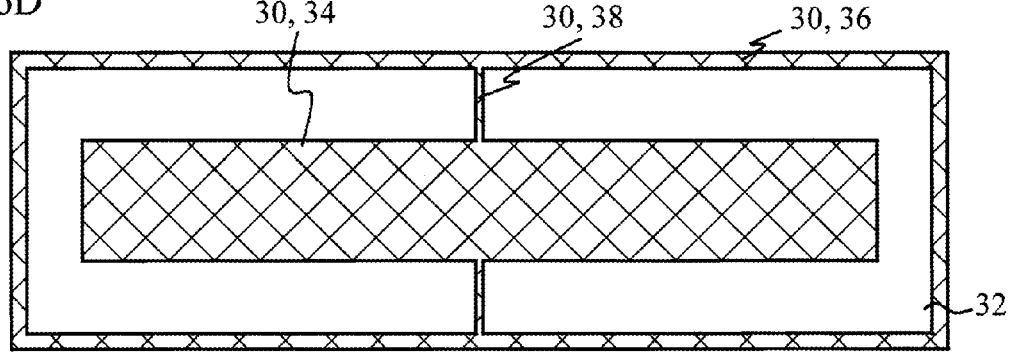
Figure 7A:
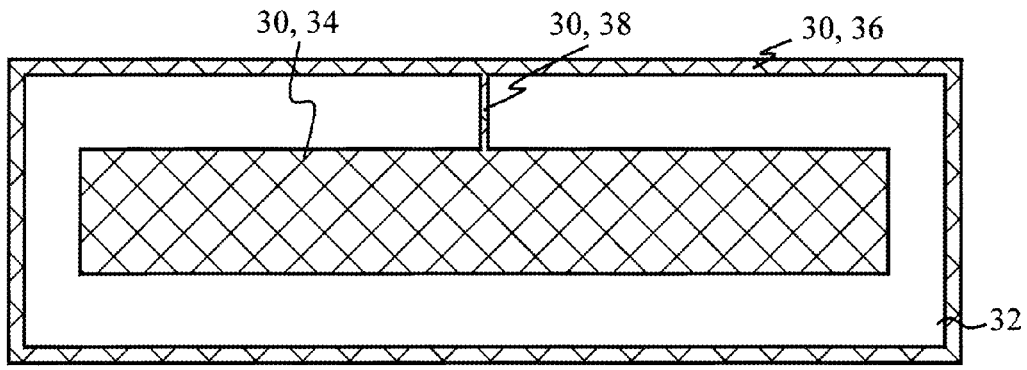
FIG. 7A through FIG. 7D are plain views illustrating semiconductor devices in accordance with variations of the first embodiment.
Figure 7B:
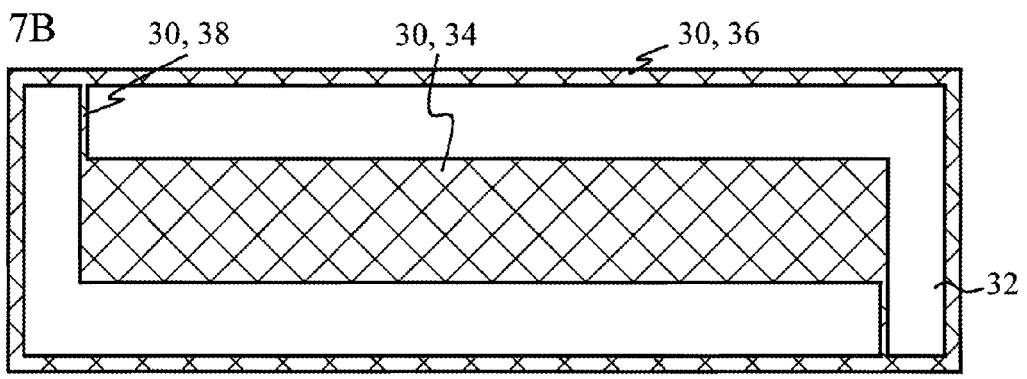
Figure 7C:
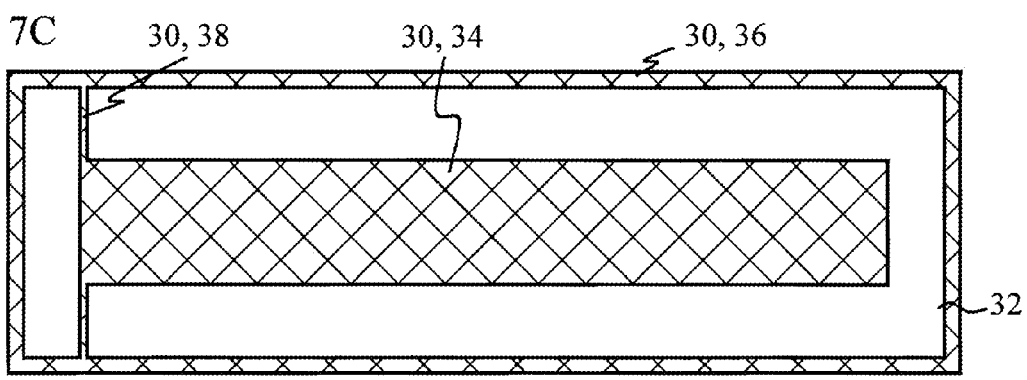
Figure 7D:
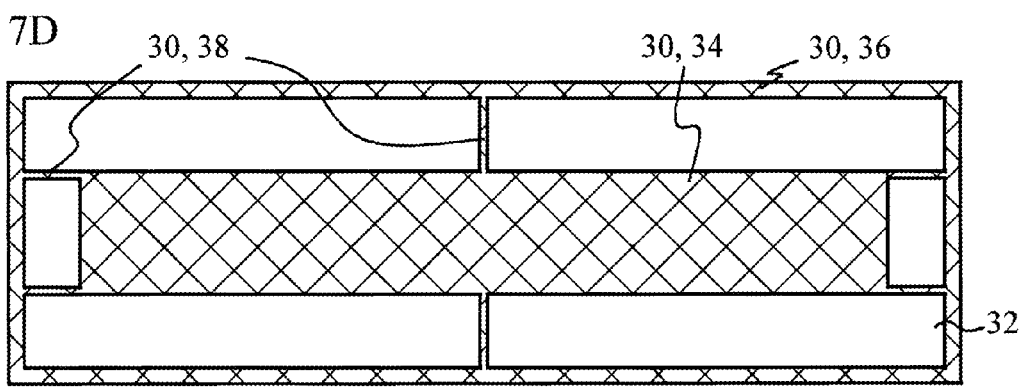
Figure 8A:
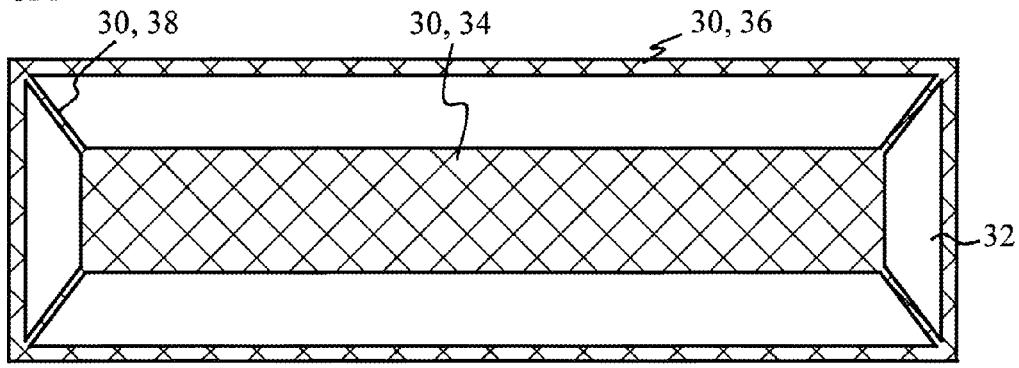
FIG. 8A through FIG. 8D are plain views illustrating semiconductor devices in accordance with variations of the first embodiment.
Figure 8B:
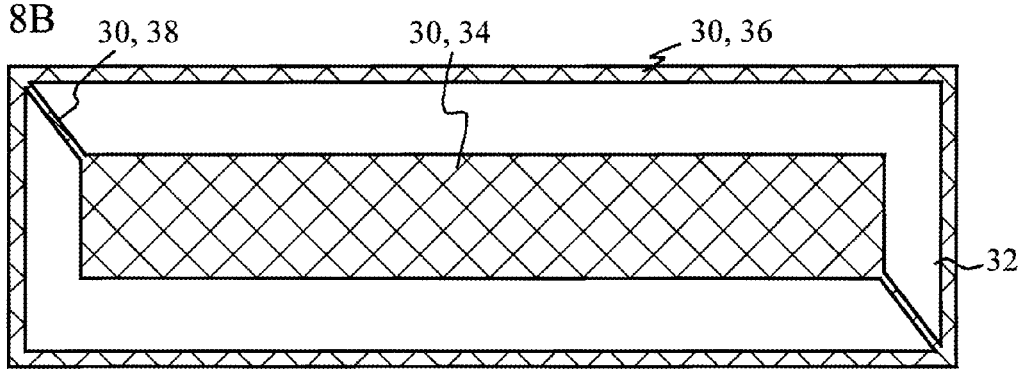
Figure 8C:
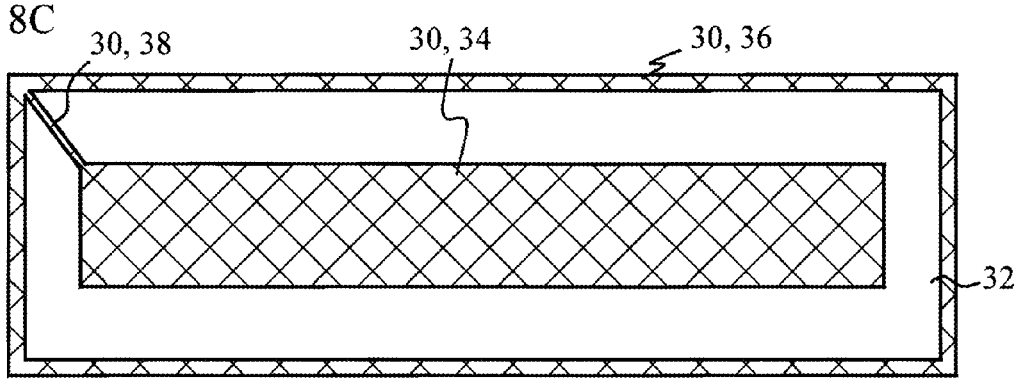
Figure 8D:
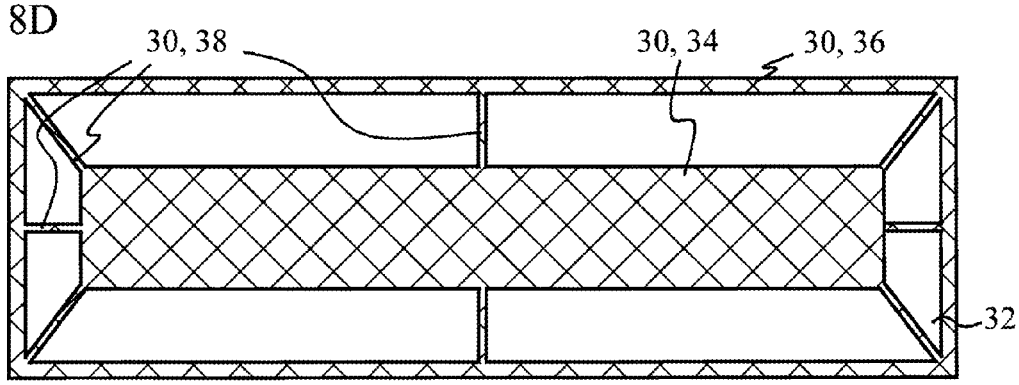
Figure 9A:
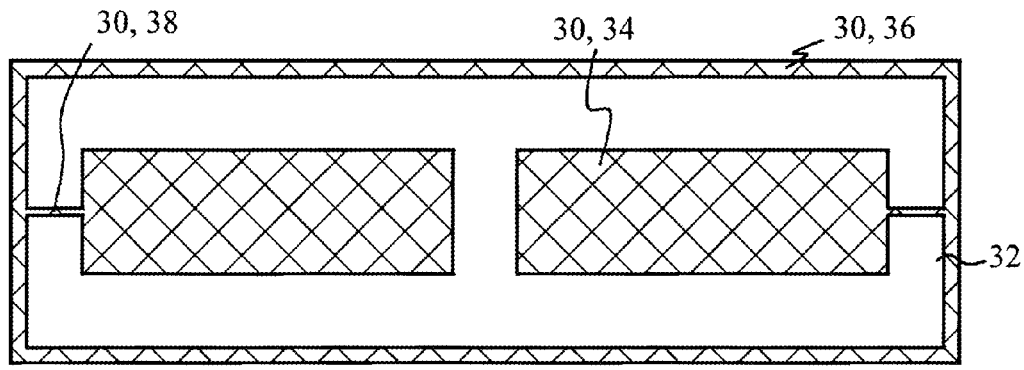
FIG. 9A through FIG. 9C are plain views illustrating semiconductor devices in accordance with variations of the first embodiment.
Figure 9B:
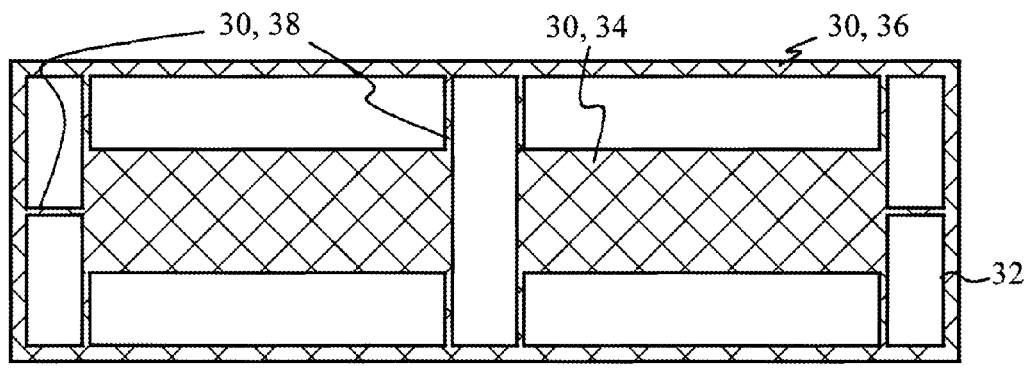
Figure 9C:
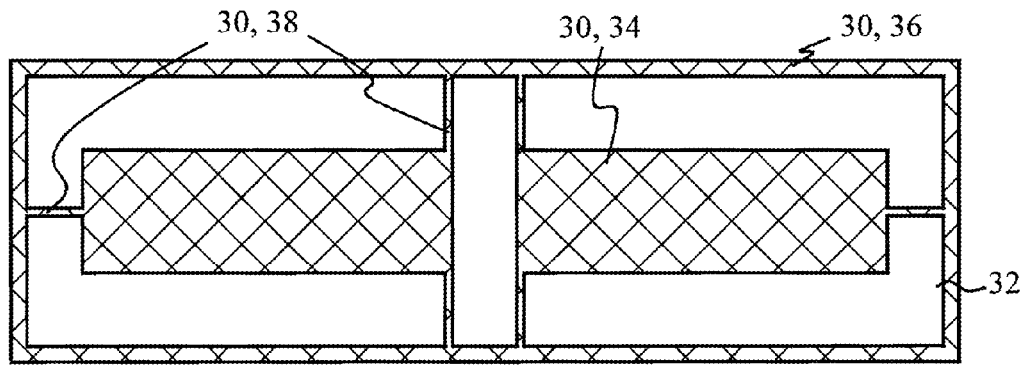
Figure 10A:
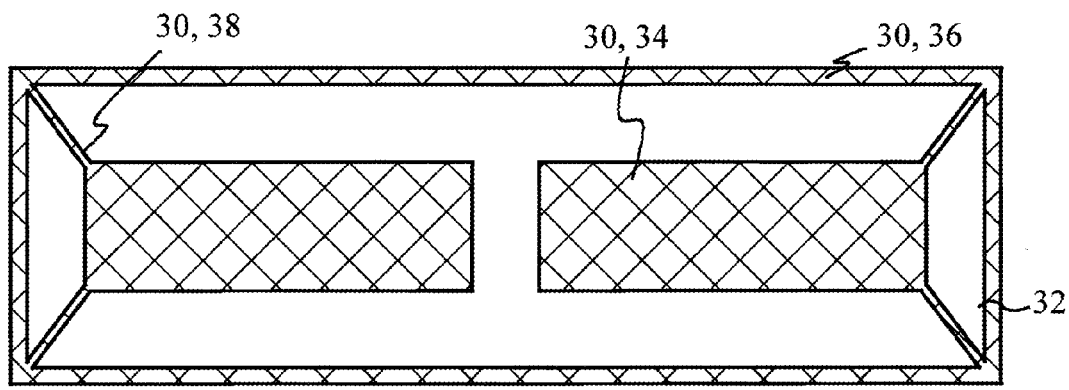
FIG. 10A and FIG. 10B are plain views illustrating semiconductor devices in accordance with variations of the first embodiment.
Figure 10B:
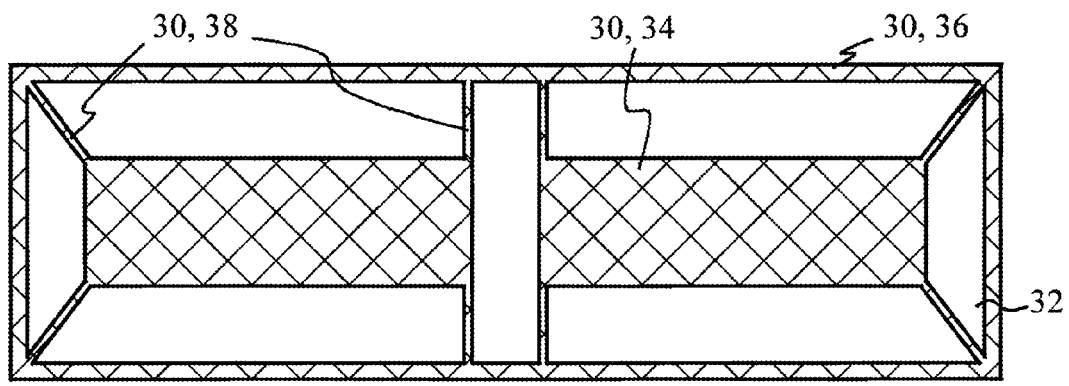

As illustrated in FIG. 6A, the number of the connection regions 38 may be one. As illustrated in FIG. 6B and FIG. 6C, the connection regions 38 may be connected to an upper end or lower end of the FET 34. As illustrated in FIG. 6D, the connection regions 38 may be connected to an upper side and a lower side of the FET 34. As illustrated in FIG. 7A through FIG. 7C, the number and positions of the connection regions 38 connected to the upper side or the lower side of the FET 34 may be changed. As illustrated in FIG. 7D, the connection regions 38 may be connected to four sides of the FET 34. As illustrated in FIG. 8A, the connection regions 38 may be connected to four corners of the FET 34. As illustrated in FIG. 8B and FIG. 8C, the connection regions 38 may be connected to at least one of four corners of the FET 34. As illustrated in FIG. 8D, the connection regions 38 may be connected to four corners and sides of the FET 34. As illustrated in FIG. 9A, when two FETs 34 are formed in a single chip, the connection regions 38 have only to be connected to each FET 34. As illustrated in FIG. 9B through FIG. 10B, the number and positions of the connection regions 38 connected to each FET 34 may be changed. When more than two FETs 34 are formed, the connection regions 38 have only to be connected to each FET 34. The paths of electrons are increased by increasing the connection regions 38, and this enables to cancel out accumulated positive electric charges efficiently. In addition, the connection regions 38 are preferably connected to positions, such as positions near the center of the FET 34 or four corners, in which positive electric charge easily remains.

In FIG. 2A, the scribe line 36 has a width equal to that of the active region 30 included in the scribe line 36, but this does not intend to limit any configuration. The scribe line 36 may have a width larger or smaller than that of the active region 30. The connection region 38 has only to connect the active region 30 in the FET 34 to the active region 30 in the scribe line 36. The active regions 30 in the FET 34, the scribe line 36, and the connection region 38 preferably have the same layer structure. That is to say, the scribe line 36 and the connection region 38 have the same structure as the channel layer in the FET 34 region that is an actual device region has. In addition, the active region 30 in the scribe line 36 preferably reaches an edge portion of the wafer. The source electrode 22 and the drain electrode 24 may be formed after the insulating layer 20 is formed or the gate electrode 26 is formed.

Second Embodiment

Figure 11A:
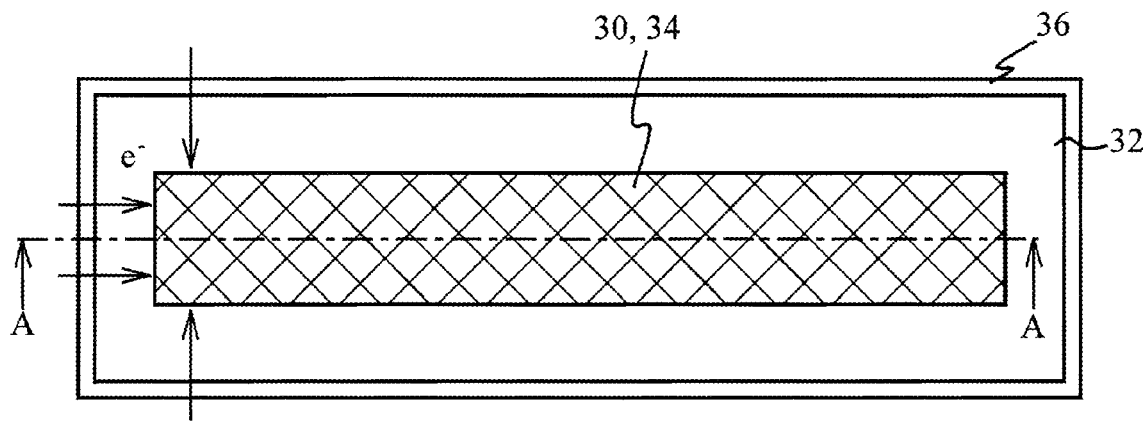
FIG. 11A is a plain view illustrating a semiconductor device in accordance with a second embodiment.
Figure 11B:
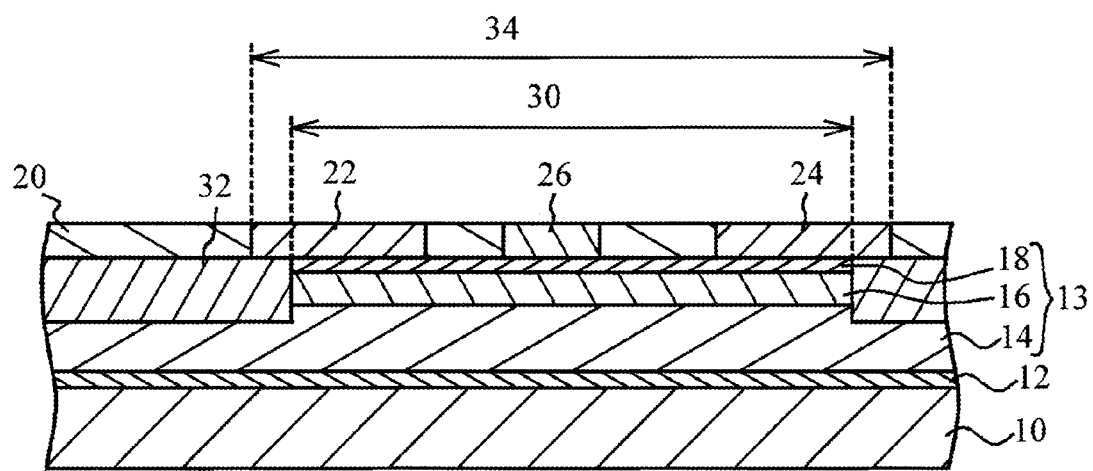
FIG. 11B is a cross-sectional view illustrating the semiconductor device in accordance with the second embodiment.

Unlike the first embodiment, a second embodiment reduces a breakdown voltage of the insulating layer 20 without using the scribe line and the connection region including the active regions 30. FIG. 11A is a plain view illustrating a semiconductor device in accordance with the second embodiment. FIG. 11B is a cross-sectional view illustrating the semiconductor device of the second embodiment. Structures of the electrodes are the same as those illustrated in FIG. 3.

As illustrated in FIG. 11A and FIG. 11B, the FET 34 includes the active region 30. The scribe line 36 does not include the active region 30, and is made of the inactive region 32. The insulating layer 20 is made of SiN or $Al_2O_3$ for example, and has a breakdown voltage of less than or equal to 4 MV/cm for example.

A description will now be given of a method for manufacturing the semiconductor device of the second embodiment. FIG. 12A through FIG. 13B are cross-sectional views illustrating the method for manufacturing the semiconductor device of the second embodiment. Here, the insulating layer 20 is assumed to be formed of SiN.

Figure 12A:
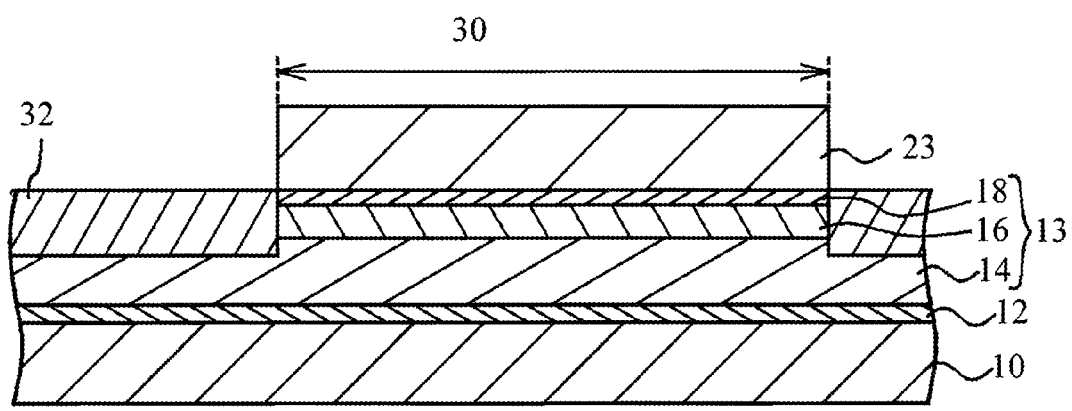
FIG. 12A and FIG. 12B are cross-sectional views illustrating a method for manufacturing the semiconductor device in accordance with the second embodiment.
Figure 12B:
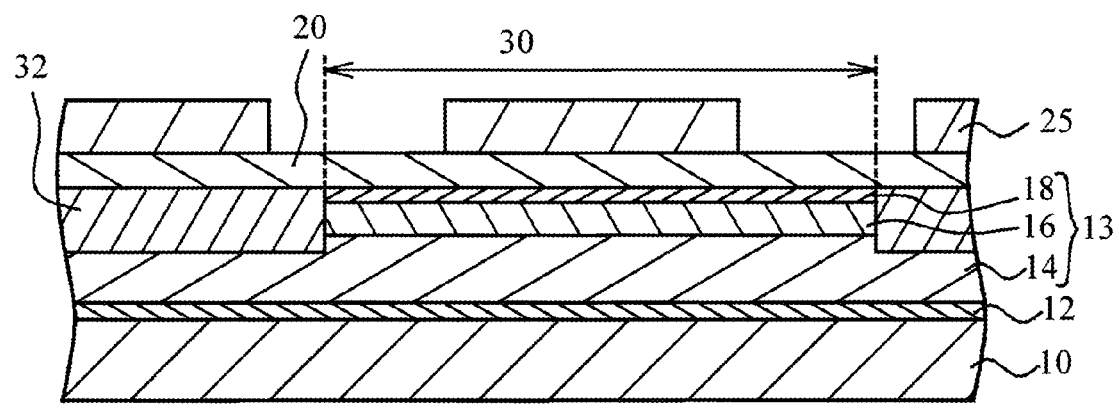

As illustrated in FIG. 12A, on the substrate 10, formed are the foundation layer 12, the GaN layer 14, the electron supply layer 16, and the cap layer 18 in this order from the substrate 10 side. The resist 23 is formed on the cap layer 18. The inactive region 32 is formed in the operating layer 13 exposed from the resist 23. As illustrated in FIG. 12B, the insulating layer 20 made of SiN is formed on the cap layer 18 by PECVD for example. The manufacturing condition of the insulating layer 20 is as follows. The growth pressure is a pressure inside the device used for PECVD. The growth temperature is a temperature of the wafer.

Figure 13A:
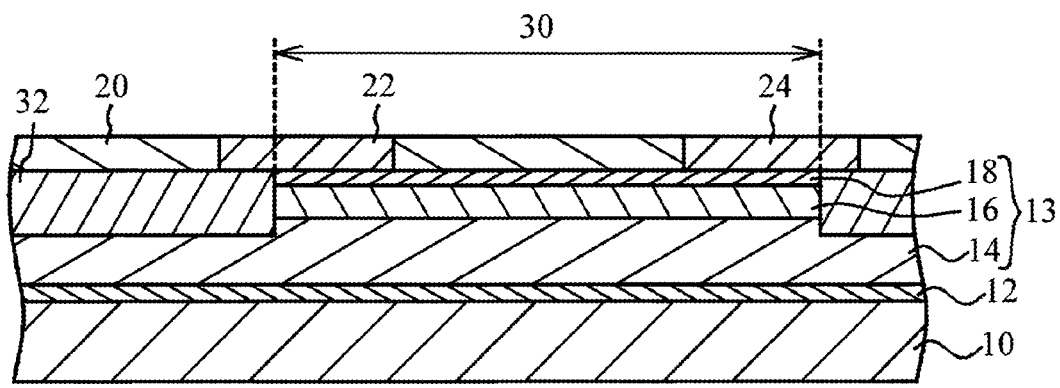
FIG. 13A and FIG. 13B are cross-sectional views illustrating the method for manufacturing the semiconductor device in accordance with the second embodiment.

Material, Carrier Gas, and Flow Rate:
silane ($SiH_4$):ammonia ($NH_3$):nitrogen ($N_2$):helium (He)=3 to 6:0 to 2:100 to 600:500 to 900 sccm ($5.07*10^{-3}$ to $10.14*10^{-3}$:0 to $3.38*10^{-3}$:$1.69*10^{-1}$ to $1.014$:$8.45*10^{-1}$ to $1.52$ Pa·m$^3$/s)
Growth pressure: 0.5 to 1.8 Torr (66.65 to 239.94 Pa)
Growth temperature: 200 to 400° C.
RF (Radio Frequency) power: 25 to 150 W Openings are formed in the insulating layer 20 by dry etching such as RIE for example. As illustrated in FIG. 13A, the source electrode 22 and the drain electrode 24 are formed by evaporation or the like for example.

Figure 13B:
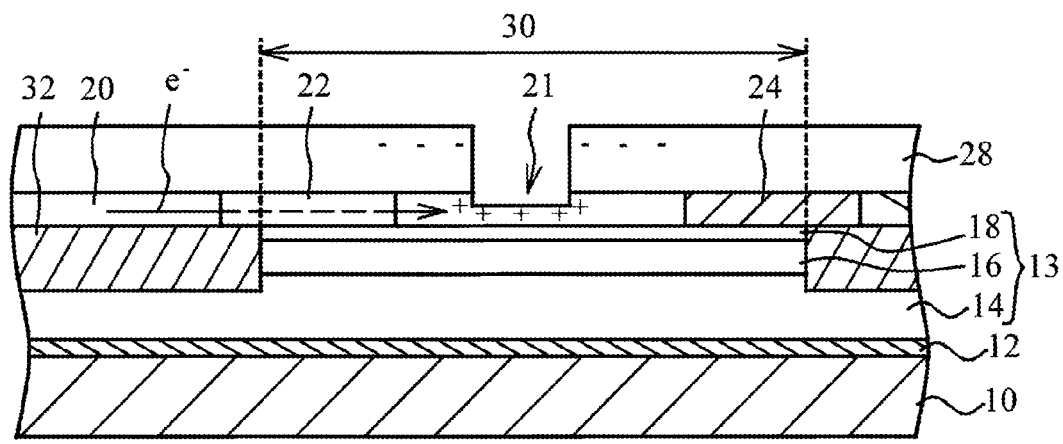

As illustrated in FIG. 13B, the resist 28 is formed on the insulating layer 20, and the opening 21 is formed in the insulating layer 20 exposed from the resist 28 by RIE. Since the breakdown voltage of the insulating layer 20 is small, less than or equal to 4 MV/cm, electrons easily transfer through the insulating layer 20 during the RIE process. As indicated with arrows in FIG. 11A and FIG. 13B, during the RIE process, electrons are supplied through the insulating layer 20, and this can prevent the insulating layer 20 from being charged. Therefore, the leakage current and the change in threshold voltage are reduced.

A description will be given of an experiment to investigate a relationship between the breakdown voltage of the insulating layer 20 and electrical characteristics of the FET. The experiment uses a semiconductor device having the structure illustrated FIG. 11A and FIG. 11B, changes the breakdown voltage of the insulating layer 20, and examines a change in threshold voltage $\Delta Vth$, and a magnitude of logarithm of a change in leakage current $\log(\Delta Igs)$. In the drawings, rectangles indicate a case of the breakdown voltage=8 MV/cm, triangles indicate a case of 6 MV/cm, rhombuses indicate a case of 5 MV/cm, and circles indicate a case of 4 MV/cm.

Figure 14A:
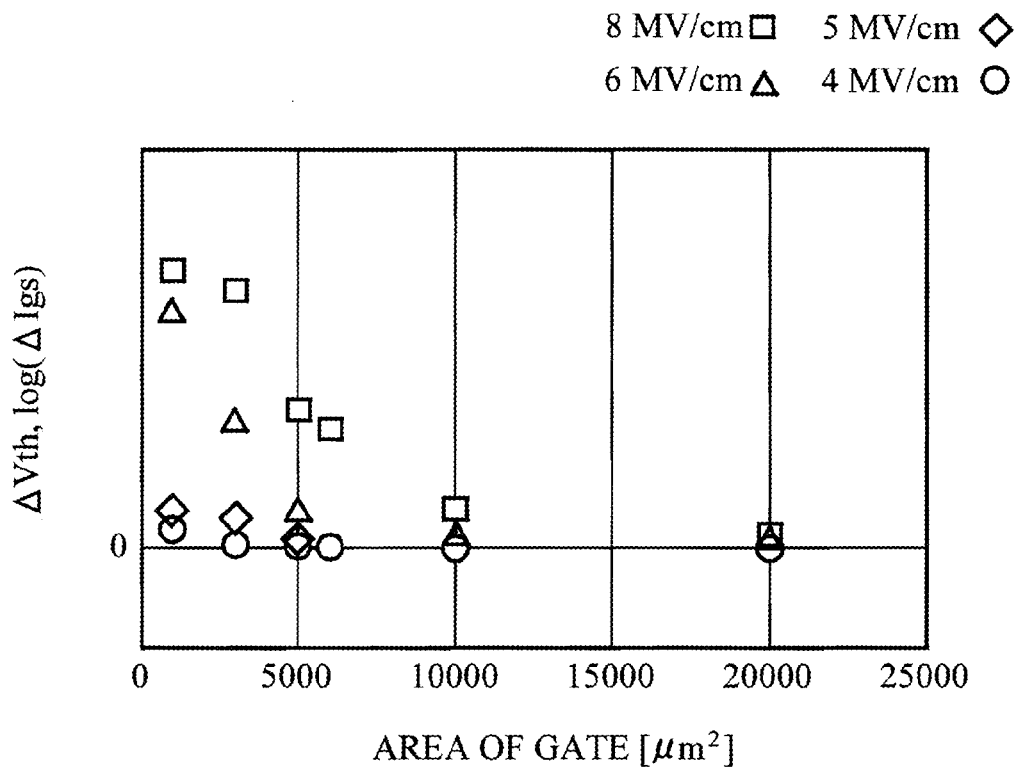
FIG. 14A and FIG. 14B are graphs illustrating changes in leakage current and threshold voltage versus an area of a gate for various breakdown voltages.
Figure 14B:
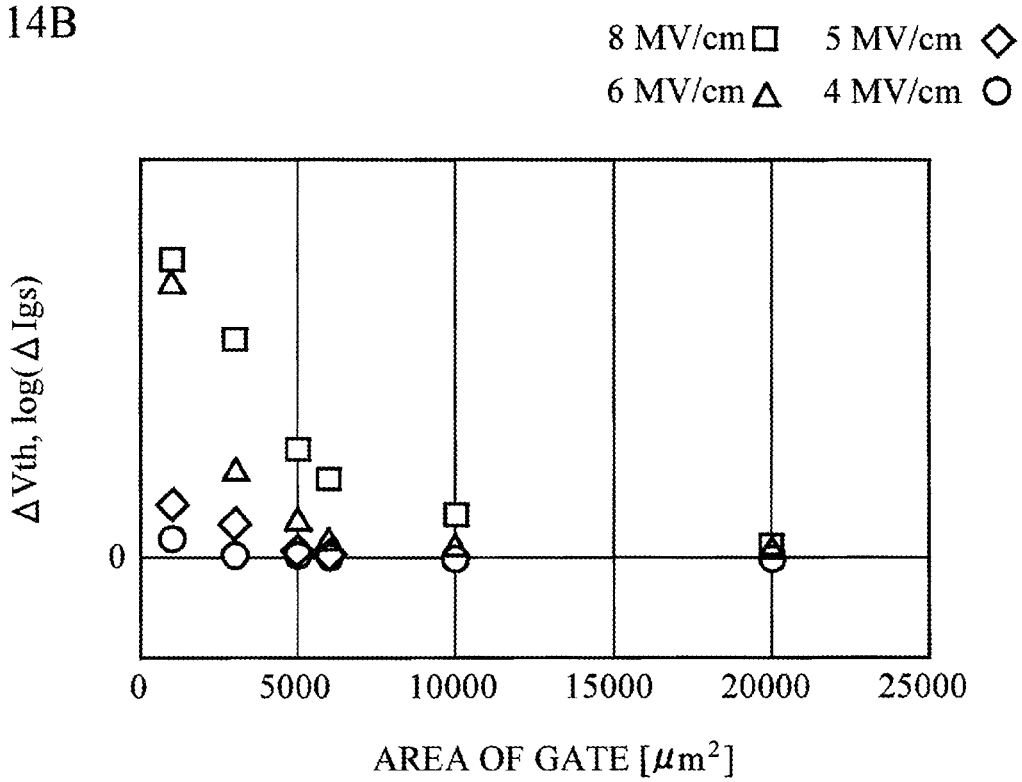

FIG. 14A and FIG. 14B are graphs illustrating changes in leakage current and threshold voltage versus an area of a gate for various breakdown voltages. FIG. 14A illustrates experimental results when the insulating layer 20 is made of SiN, and FIG. 14B illustrates experimental results when the insulating layer 20 is made of $Al_2O_3$. A horizontal axis represents the area of the gate, and a vertical axis represents $\Delta Vth$ or $\log(\Delta Igs)$. The area of the gate is an area of a part of the gate electrode 26 overlapping with the active region 30. For example, the area of the gate in FIG. 3 is calculated by multiplying a product of width W and length L of a part of the gate finger 26a overlapping with the active region 30 by the number of the gate fingers 26a.

As illustrated in FIG. 14A and FIG. 14B, when the breakdown voltage is 8 MV/cm or 6 MV/cm, ΔVth and log(ΔIgs) becomes larger as the area of the gate becomes smaller. In particular, when the area of the gate is less than or equal to 5000 μm², ΔVth and log(ΔIgs) increase rapidly. This is because positive electric charges concentrate in a small area. In contrast to this, ΔVth and log(ΔIgs) are significantly small when the breakdown voltage is 5 MV/cm, and further small when the breakdown voltage is 4 MV/cm. In particular, even when the area of the gate is less than or equal to 5000 μm², ΔVth and log(ΔIgs) are close to zero.

Figure 15A:
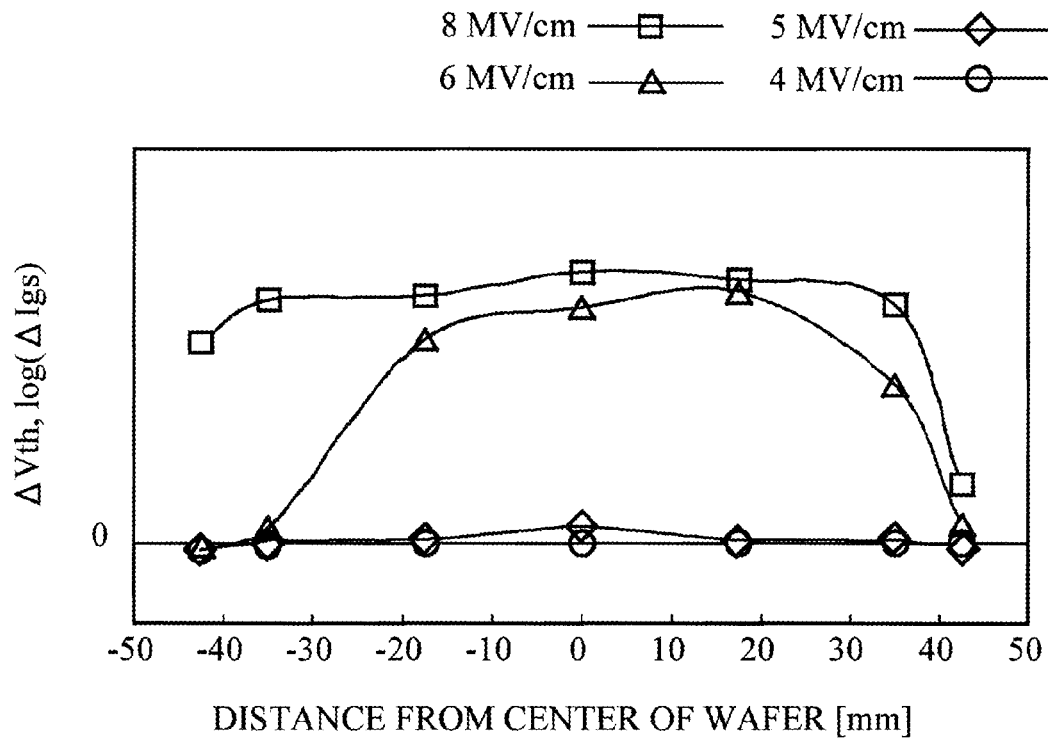
FIG. 15A and FIG. 15B are graphs illustrating changes in leakage current and threshold voltage in a wafer for various breakdown voltages.
Figure 15B:
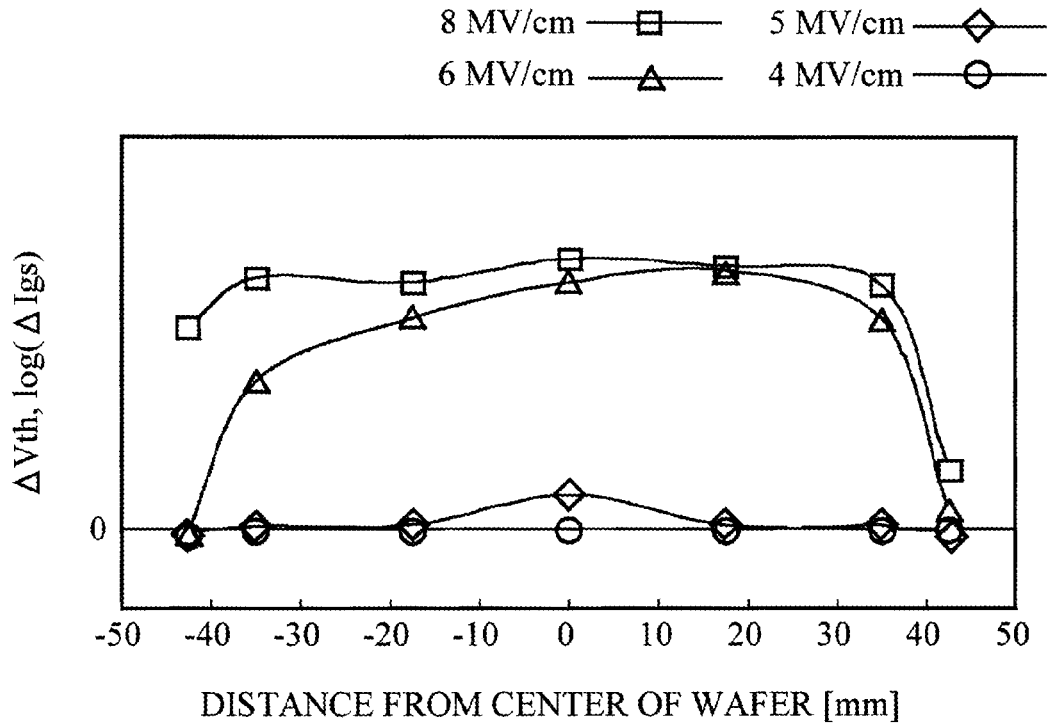

FIG. 15A and FIG. 15B are graphs illustrating changes in leakage current and threshold voltage in the wafer for various breakdown voltages. A horizontal axis represents a distance from the center of the wafer. Positive values in the horizontal axis represent a distance from the center to one direction, and negative values represent a distance from the center to the other direction. The area of the gate is 1000 μm².

As illustrated in FIG. 15A and FIG. 15B, when the breakdown voltage is 8 MV/cm or 6 MV/cm, ΔVth and log(ΔIgs) are large, and large especially around the center of the wafer. In contrast to this, ΔVth and log(ΔIgs) are significantly small when the breakdown voltage is 5 MV/cm or 4 MV/cm. In particular, ΔVth and log(ΔIgs) are close to zero even around the center of the wafer. As described above, changes in leakage current and threshold voltage are significantly reduced by making the breakdown voltage of the insulating layer 20 less than or equal to 4 MV/cm.

Figure 16A:
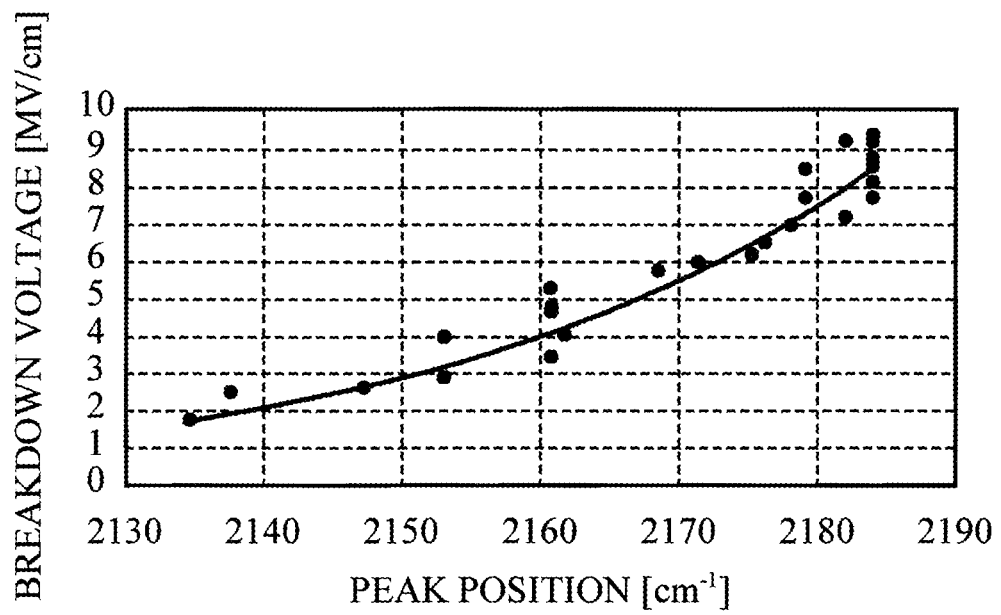
FIG. 16A and FIG. 16B are graphs illustrating a relationship between an FTIR peak position and a breakdown voltage.
Figure 16B:
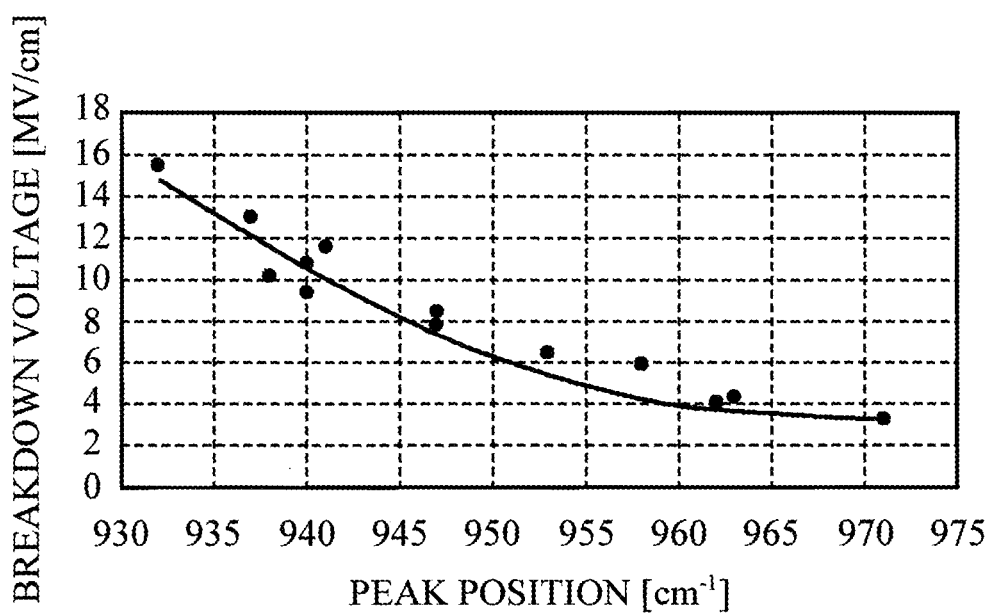

A desired value of the breakdown voltage of the insulating layer 20 can be obtained by making a peak position of FTIR (Fourier Transform Infrared spectrometer) of the insulating layer 20 within a given range. FIG. 16A and FIG. 16B are graphs illustrating a relationship between an FTIR peak position and a breakdown voltage. FIG. 16A illustrates a relationship when the insulating layer 20 is made of SiN, and a horizontal axis represents a peak position of a Si—N stretching vibration. FIG. 16B illustrates a relationship when the insulating layer 20 is made of $Al_2O_3$, and a horizontal axis represents a peak position of an Al—O stretching vibration. A vertical axis represents a breakdown voltage.

As illustrated in FIG. 16A, when the peak position of the Si—N stretching vibration in the insulating layer 20 made of SiN is less than or equal to 2160 cm$^{-1}$, the breakdown voltage is less than or equal to 4 MV/cm. As illustrated in FIG. 16B, when the peak position of the Al—O stretching vibration in the insulating layer 20 made of $Al_2O_3$ is greater than or equal to 960 cm$^{-1}$, the breakdown voltage is less than or equal to 4 MV/cm. Therefore, the FTIR peak position of the Si—N stretching vibration in the insulating layer 20 made of SiN is preferably less than or equal to 2160 cm$^{-1}$, more preferably 2150 cm$^{-1}$, and further preferably 2140 cm$^{-1}$. The FTIR peak position of the Al—O stretching vibration in the insulating layer 20 made of $Al_2O_3$ is preferably greater than or equal to 960 cm$^{-1}$, more preferably 965 cm$^{-1}$, and further preferably 970 cm$^{-1}$. Other layers may exist between the cap layer 18 and the insulating layer 20, but the insulating layer 20 preferably contacts the operating layer 13 to supply electrons efficiently. When the insulating layer 20 has a multilayered structure made of plural insulating layers, an insulating layer that contacts the cap layer 18 preferably has the above described peak position.

When the insulating layer 20 is formed with $Al_2O_3$, ALD (Atomic Layer Deposition) may be used. Trimethyle aluminum (TMA) is supplied for 50 to 500 msec for example. Ventilation is performed for 5 to 15 sec for example. Oxidizing agent such as ozone, water, or $O_2$ plasma is added for 50 to 500 msec. Ventilation is performed for 5 to 15 sec. Then, TMA is supplied again. The above cycle is repeated, and the insulating layer 20 is grown. The growth temperature is 100 to 500° C.

Third Embodiment

Figure 17A:
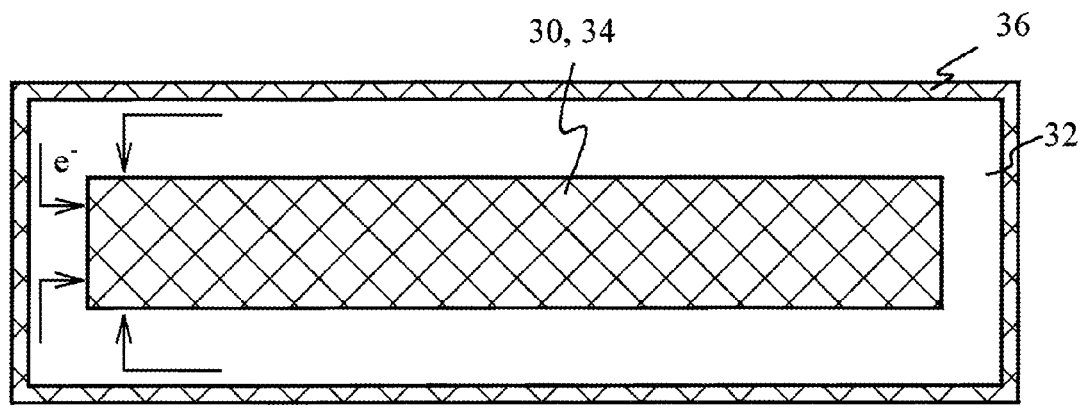
FIG. 17A is a plain view illustrating a semiconductor device in accordance with a third embodiment.

A third embodiment does not use the connection region 38 used in the first embodiment, but uses the scribe line including the active region and an insulating layer with a small breakdown voltage. FIG. 17A is a plain view illustrating a semiconductor device in accordance with the third embodiment. A cross-sectional view is the same as FIG. 2C. As illustrated in FIG. 17A, the FET 34 and the scribe line 36 include the active regions 30. As with the second embodiment, the peak position of the Si—N stretching vibration is less than or equal to 2160 cm$^{-1}$ when the insulating layer 20 is formed of SiN, and the peak position of the Al—O stretching vibration is greater than or equal to 960 cm$^{-1}$ when the insulating layer 20 is formed of $Al_2O_3$. Therefore, the breakdown voltage of the insulating layer 20 is less than or equal to 4 MV/cm.

Figure 17B:
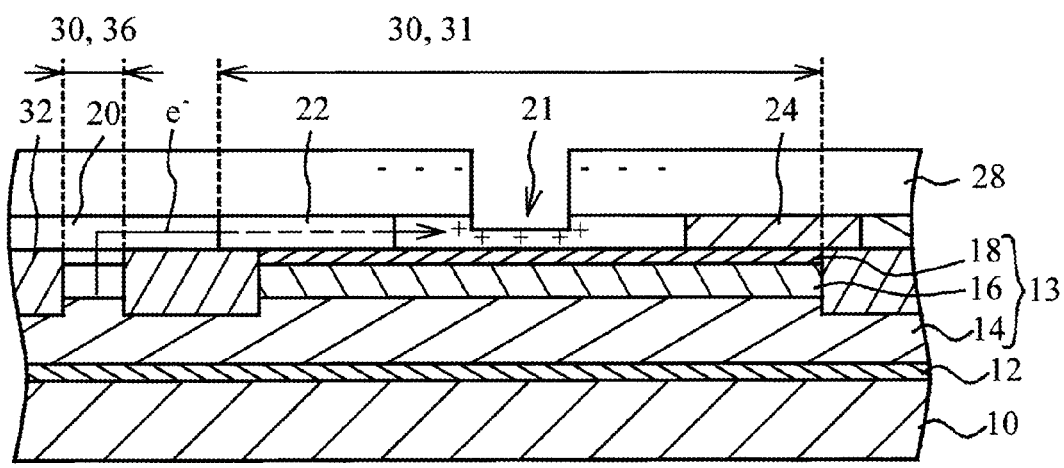
FIG. 17B is a cross-sectional view illustrating a method for manufacturing the semiconductor device in accordance with the third embodiment.

FIG. 17B is a cross-sectional view illustrating a method for manufacturing the semiconductor device in accordance with the third embodiment. Structures described in FIG. 11A through FIG. 13A are common to the third embodiment. As the insulating layer 20 extends to contact the scribe line 36, electrons easily transfer through the scribe line 36 and the insulating layer 20 as illustrated in FIG. 17B. This cancels out the positive electric charges accumulated around the aperture 21, and reduces accumulated charges. As with the first and second embodiments, the third embodiment reduces the leakage current and the change in threshold voltage.

The first embodiment may use the insulating layer 20 with a small breakdown voltage. This enables to cancel out accumulated positive electric charges because electrons are supplied through the scribe line 36, the connection region 38, and the insulating layer 20. Therefore, the accumulated charges can be reduced. The first through third embodiments may apply to IC (Integrated Circuit) such as MMIC (Monolithic Microwave Integrated Circuit). The first and third embodiments connect the scribe line 36 to the FET 34. However, the present invention is applicable even when the scribe line 36 does not have the active region. When the scribe line 36 does not have the active region, the effects of the present invention can be obtained by interconnecting the regions of the FETs 34 with the connection regions 38.

The nitride semiconductor layers such as the foundation layer 12, the GaN layer 14, the electron supply layer 16, and the cap layer 18 may be formed of a nitride semiconductor other than the above described one. The nitride semiconductor is a semiconductor including nitrogen (N). Aluminum nitride (AlN), indium gallium nitride (InGaN), indium nitride (InN), and aluminum indium gallium nitride (AlInGaN) are examples of the nitride semiconductor. A buffer layer made of AlN and a channel layer made of GaN may be provided instead of the GaN layer 14. The electron supply layer 16 may be made of InAlN or AlInGaN of the nitride semiconductor.

Figure 18:
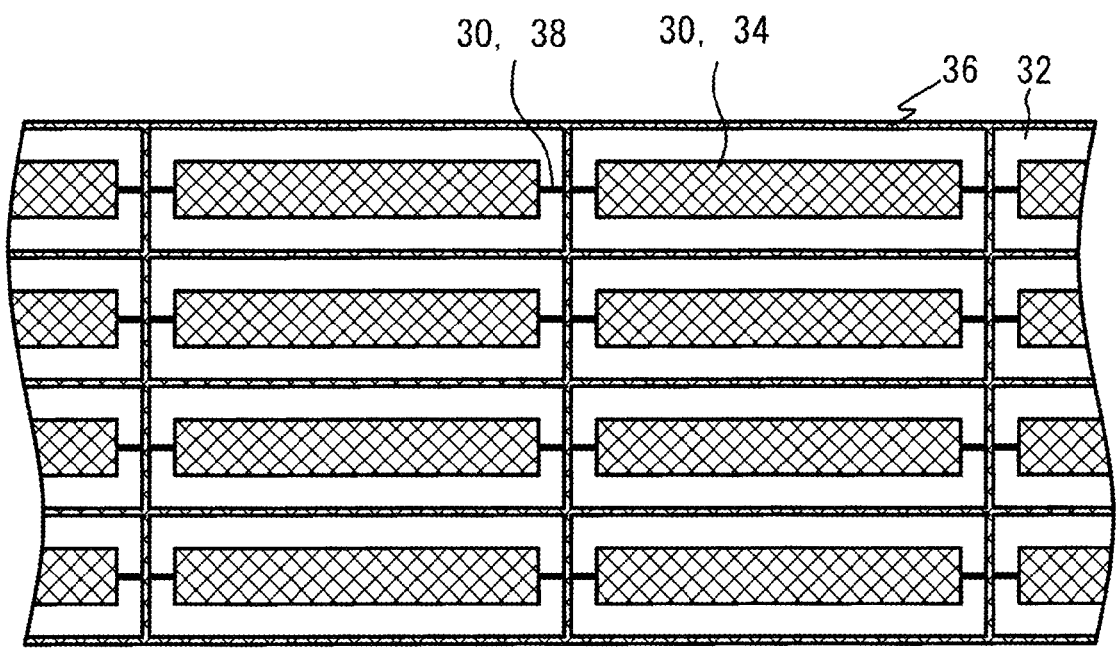
FIG. 18 is a plain view illustrating a part of a wafer.

FIG. 18 is a plain view illustrating a part of a wafer. As illustrated in FIG. 18, multiple semiconductor devices are formed on the wafer. The scribe line 36 is located at boundaries between the semiconductor devices. The first through third embodiments describe only one of the semiconductor devices in the wafer.

The present invention is not limited to the specifically disclosed embodiments and variations but may include other embodiments and variations without departing from the scope of the present invention.

What is claimed is:

1. A method for manufacturing a semiconductor device comprising:
    forming a first active region, a second active region, an inactive region located between the first active region and the second active region, and a third active region;
    wherein the inactive region surrounds the first active region and the second active region surrounds the inactive region;
    wherein the third active region is formed directly in the inactive region so as to directly connect the first active region to the second active region, in a semiconductor layer;
    forming an insulating layer on the semiconductor layer;
    forming an opening selectively in the insulating layer by dry etching.

2. The method according to claim 1, wherein
    the second active region is a scribe line.

3. The method according to claim 2, wherein
    a plurality of the first active regions are formed, and
    each of the plurality of the first active regions is directly connected to the second active region by at least one of a plurality of the third active regions.

4. The method according to claim 1, wherein
    the first active region includes a layer functioning as a channel layer of a field-effect transistor, and
    the second active region and the third active region have the same layer structure as the first active region has.

5. The method according to claim 1, wherein
    the insulating layer is made of silicon nitride, of which an FTIR peak position of a silicon-nitrogen stretching vibration is less than or equal to 2160 $cm^{-1}$, or of aluminum oxide, of which an FTIR peak position of an aluminum-oxygen stretching vibration is greater than or equal to 960 $cm^{-1}$.

6. The method according to claim 1, wherein
    the semiconductor layer is made of a nitride semiconductor.

7. The method according to claim 1, wherein
    the dry etching is performed by RIE, ICP etching, or ECR etching.

8. The method according to claim 4, wherein
    the first active region further includes an electron supply layer and a cap layer.

9. A method for manufacturing a semiconductor device comprising:
    forming a first active region, a second active region, an inactive region located between the first active region and the second active region, and a third active region,
    wherein the inactive region surrounds the first active region and the second active region surrounds the inactive region;
    wherein the third active region is formed directly in the inactive region so as to directly connect the first active region to the second active region, in a semiconductor layer; and
    applying dry-etching by RIE, ICP etching, or ECR etching.

* * * * *